United States Patent
Spann et al.

(10) Patent No.: US 12,543,611 B2
(45) Date of Patent: Feb. 3, 2026

(54) METHOD TO CONNECT POWER TERMINAL TO SUBSTRATE WITHIN SEMICONDUCTOR PACKAGE

(71) Applicant: Littelfuse, Inc., Chicago, IL (US)

(72) Inventors: Thomas Spann, Fürth (DE); Elaheh Arjmand, Chippenham (GB)

(73) Assignee: Littelfuse, Inc., Rosemont, IL (US)

( * ) Notice: Subject to any disclaimer, the term of this patent is extended or adjusted under 35 U.S.C. 154(b) by 370 days.

(21) Appl. No.: 18/136,554

(22) Filed: Apr. 19, 2023

(65) Prior Publication Data

US 2024/0355718 A1    Oct. 24, 2024

(51) Int. Cl.
*H01L 23/498* (2006.01)
*H01L 21/56* (2006.01)
(Continued)

(52) U.S. Cl.
CPC ........ *H01L 23/49811* (2013.01); *H01L 21/56* (2013.01); *H01L 23/293* (2013.01);
(Continued)

(58) Field of Classification Search
CPC . H01L 23/49811; H01L 21/56; H01L 23/293; H01L 23/3121; H01L 23/3735; H01L 23/49866; H01L 24/32; H01L 24/48; H01L 24/73; H01L 2224/32175; H01L 2224/48175; H01L 2224/73265; H01L 23/24; H01L 23/053; H01L 23/36; H01L 24/42; H01L 25/50; H01L 21/4853; H01L 25/072; H01L 23/49844; H01L 21/60;
(Continued)

(56) References Cited

U.S. PATENT DOCUMENTS

2009/0246918 A1*  10/2009  Noro ................ H01L 24/75
                                              257/E21.502
2015/0130079 A1*   5/2015  Sakamoto ......... H01L 23/49816
                                              257/774
(Continued)

FOREIGN PATENT DOCUMENTS

JP    2009105266 A    5/2009
JP    2022026626 A    2/2022
(Continued)

OTHER PUBLICATIONS

Extended European Search Report for EP Application No. 24169302.7, dated Jul. 31, 2024, 9 pages.

*Primary Examiner* — Moazzam Hossain
(74) *Attorney, Agent, or Firm* — KDW Firm PLLC

(57) ABSTRACT

A method of manufacturing a power semiconductor device in accordance with an embodiment of the present disclosure may include providing a substrate disposed atop a heatsink, electrically connecting a semiconductor die to a top surface of the substrate, disposing a thin metallic layer atop the substrate, disposing a terminal atop the thin metallic layer, and performing a welding operation wherein a laser beam is directed at a top surface of the terminal to produce a plurality of weld connections connecting the terminal to the substrate, wherein the weld connections are separated by gaps, and wherein heat generated during the welding operation melts the thin metallic layer and molten material of the thin metallic flows into the gaps.

9 Claims, 3 Drawing Sheets

(51) Int. Cl.
  *H01L 23/29* (2006.01)
  *H01L 23/31* (2006.01)
  *H01L 23/373* (2006.01)
  *H01L 23/00* (2006.01)
(52) U.S. Cl.
  CPC ...... *H01L 23/3121* (2013.01); *H01L 23/3735* (2013.01); *H01L 23/49866* (2013.01); *H01L 24/32* (2013.01); *H01L 24/48* (2013.01); *H01L 24/73* (2013.01); *H01L 2224/32175* (2013.01); *H01L 2224/48175* (2013.01); *H01L 2224/73265* (2013.01)
(58) Field of Classification Search
  CPC . H01L 23/488; H01L 23/3677; H01L 21/768; H01L 23/142; H01L 23/5283; H01L 23/5286; H01L 23/53214; H01L 23/53228; H01L 23/53242; H01L 23/564; H01L 24/02; H01L 2224/03552

USPC ........................................................ 257/675
See application file for complete search history.

(56) References Cited

U.S. PATENT DOCUMENTS

2016/0071778 A1* 3/2016 Otsubo ................. H01L 21/486
                                                            257/687
2021/0407954 A1  12/2021  Yoshihara
2022/0199566 A1   6/2022  Fuji
2022/0310409 A1   9/2022  Arjmand

FOREIGN PATENT DOCUMENTS

KR    1020170130179 A   11/2017
TW        202312292 A    3/2023

* cited by examiner

METHOD TO CONNECT POWER TERMINAL TO SUBSTRATE WITHIN SEMICONDUCTOR PACKAGE

FIELD OF THE DISCLOSURE

Embodiments of the present disclosure relate to power semiconductors and, more particularly, to a technique for connecting a power terminal to a substrate within a power module semiconductor package.

BACKGROUND

Power semiconductors are components used to convert energy from one form to another at various stages between the points of energy generation and energy consumption. A power semiconductor component can take the form of a discrete transistor, thyristor, diode, insulated gate bipolar transistor (IGBT), or metal oxide semiconductor field effect transistor (MOSFET). Or, if a higher level of current or integration is required, the component can take the form of a multi-chip module, which contains more than one of these chips or dies in a desired configuration or topology. Power semiconductors may be packaged in a variety of discrete and multi-chip module formats.

Power semiconductor devices include power terminals extending from the semiconductor packaging for connection to printed circuit boards and other circuit elements. The power terminals may be connected to the semiconductor packaging using conventional technologies such as soldering, sintering, and welding, e.g., high-current pulse welding, and ultrasonic welding. However, ultrasonic welding is messy, as particles, whiskers, or debris-like particles are generated during the welding process. Further, the generated debris is electrically conductive and able to disturb the function of the power semiconductor unit and/or the substrate of the semiconductor packaging may be cracked or otherwise damaged during the ultrasonic welding process.

To address the shortcomings described above, U.S. Pat. No. 10,720,376 discloses a method to connect terminals inside discrete packages using laser welding to attach a leadframe to a Direct Copper Bonded (DCB) substrate. While laser welding is cleaner and generally provides stronger bonds than conventional bonding techniques (e.g., ultrasonic welding), it is associated with certain disadvantages. For example, depending on the laser energy and the particular weld pattern used, laser welding may leave certain areas of a desired bonding region unbonded or weakly bonded. Such unbonded or weakly bonded regions may be detrimental to the conductivity and mechanical strength of the interface, which may compromise the reliability of a power semiconductor device.

It is with respect to these and other considerations that the present improvements may be useful.

SUMMARY

This Summary is provided to introduce a selection of concepts in a simplified form that are further described below in the Detailed Description. This Summary is not intended to identify key or essential features of the claimed subject matter, nor is it intended as an aid in determining the scope of the claimed subject matter.

A power semiconductor device in accordance with an embodiment of the present disclosure may include a heatsink, a substrate disposed atop the heatsink, a semiconductor die disposed atop, and electrically connected to, the substrate, and a terminal disposed atop, and electrically connected to, the substrate by weld connections separated by gaps, wherein the gaps are filled by a thin metallic layer.

A method of manufacturing a power semiconductor device in accordance with an embodiment of the present disclosure may include providing a substrate disposed atop a heatsink, electrically connecting a semiconductor die to a top surface of the substrate, disposing a thin metallic layer atop the substrate, disposing a terminal atop the thin metallic layer, and performing a welding operation wherein a laser beam is directed at a top surface of the terminal to produce a plurality of weld connections connecting the terminal to the substrate, wherein the weld connections are separated by gaps, and wherein heat generated during the welding operation melts the thin metallic layer and molten material of the thin metallic flows into the gaps.

DETAILED DESCRIPTION

Figure 1:
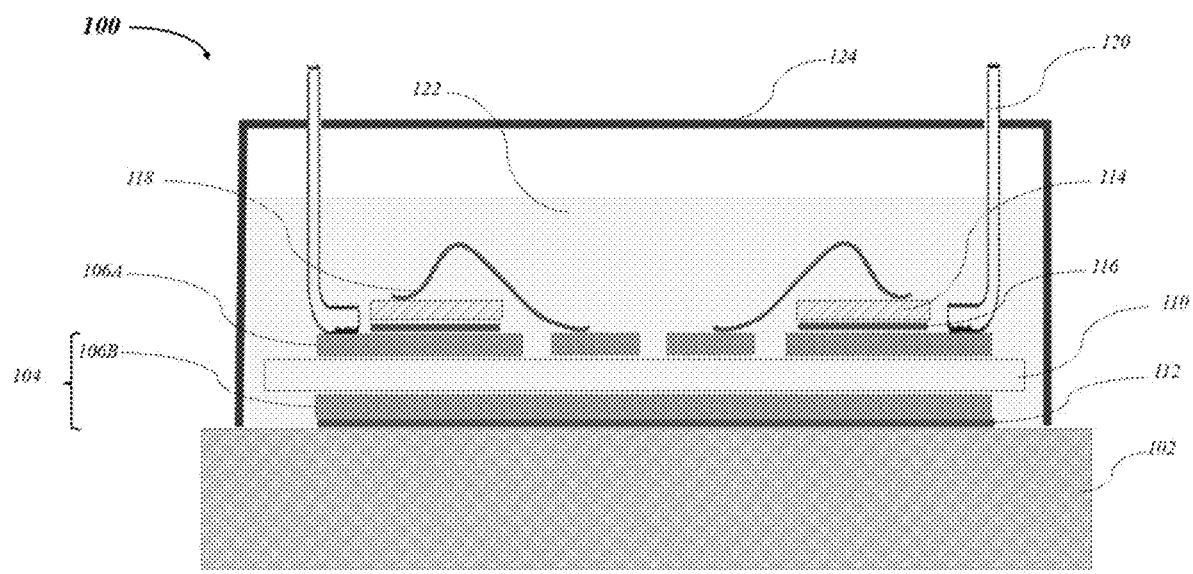
FIG. 1 is a cross-sectional view illustrating a power semiconductor device in accordance with an exemplary embodiment of the present disclosure.

Embodiments of a laser bonding method and an associated power semiconductor device in accordance with the present disclosure will now be described more fully with reference to the accompanying drawings, in which preferred embodiments of the present disclosure are presented. The method and device of the present disclosure may, however, be embodied in many different forms and should not be construed as being limited to the embodiments set forth herein. Rather, these embodiments are provided so that this disclosure will be thorough and complete, and will fully convey the scope of the method and device to those skilled in the art. In the drawings, like numbers refer to like elements throughout unless otherwise noted.

FIG. 1 is a representative cross-sectional view of a power semiconductor device 100 (hereinafter "the device 100") according to exemplary embodiments of the present disclosure. The device 100 may include a metal heatsink 102, which pulls heat away from other components of the device and forms the baseplate of the device 100. A multilayer substrate 104 may be positioned atop the heatsink 102 and may include first and second conductive layers 106A and 106B (collectively, "the conductive layers 106") disposed on top and bottom surfaces of an insulating layer 110. In various embodiments, the conductive layers 106 may be formed of copper and the insulating layer 110 may be formed of ceramic (e.g., aluminum oxide, aluminum nitride, etc.). The present disclosure is not limited in this regard.

The substrate 104 may be soldered or sintered to the heatsink 102 by a solder or sinter layer 112. Silicon or silicon-based semiconductor chips or dies 114 may be connected to a top surface of the first conductive layer 106A of the substrate 104 by a solder or sinter layer 116. Metal wires, ribbons, clips, or the like (hereinafter "the metal wires 118") may connect top surfaces of the semiconductor dies 114 to portions of first conductive layer 106A, thus providing electrical interconnections within the package. Contact elements/terminal leads 120 (hereinafter referred to as "the terminals 120") may also be connected to the top surface of the first conductive layer 106A of the substrate 104 as further described below. In exemplary embodiments, the terminals 120 may be formed of highly electrically conductive metals, such as copper, copper alloy, aluminum, aluminum alloy, silver, or silver alloy. Additionally, the terminals 120 may be plated with nickel, silver, or gold, which may be physically or chemically applied to the surfaces of the terminals 120. The present disclosure is not limited in this regard.

An encapsulation layer 122 may encase the circuit components above the heatsink 102, and a cover 124 formed of a durable, dielectric material (e.g., plastic) may be disposed over the circuit components and may protect the circuit components from external elements, with portions of the terminals 120 protruding from the cover 124 for facilitating electrical connection of the device 100 within a circuit. In various embodiments, the encapsulation layer 122 may be formed of silicone gel, epoxy molding compound (EMC), or mixtures thereof. Additionally, embodiments of the device 100 are contemplated in which the cover 124 is entirely omitted, such as if the device 100 includes module-type semiconductor packing with EMC used for the encapsulation layer 122. The present disclosure is not limited in this regard.

Figure 2:
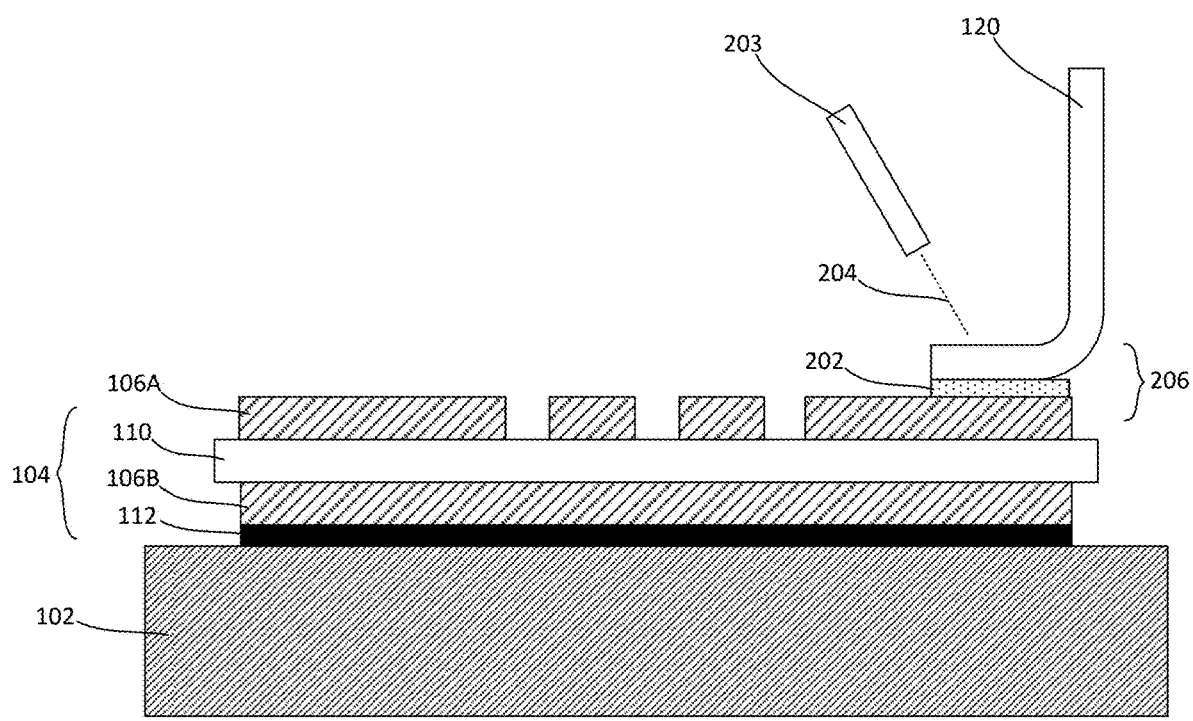
FIG. 2 is a cross-sectional view illustrating the power semiconductor device of FIG. 1 during an assembly step thereof in accordance with an exemplary embodiment of the present disclosure.

Referring to FIG. 2, there is shown a cross-sectional view of the above-described device 100 during an assembly step thereof, wherein one of the terminals 120 is being bonded to the first conductive layer 106A of the substrate 104 using a laser bonding technique in accordance with embodiments of the present disclosure. During this assembly step, a thin metallic layer 202 may be disposed atop the first conductive layer 106A, and the terminal 120 may then be placed atop the thin metallic layer 202. The thin metallic layer 202 may be formed of tin or other metals and/or metal alloys having good electrical conductivity and a low melting point (e.g., a melting point below 450 degrees Celsius). More generally, the thin metallic layer 202 may have a melting point lower than that of the material from which the terminal 120 is formed. In various embodiments, the thin metallic layer 202 may be a thin sheet of metal or foil. In other embodiments, the thin metallic layer 202 may be formed of solder paste, sinter paste, etc. The thin metallic layer 202 may have a thickness in a range of 20-100 μm. The present disclosure is not limited in this regard.

Figure 3:
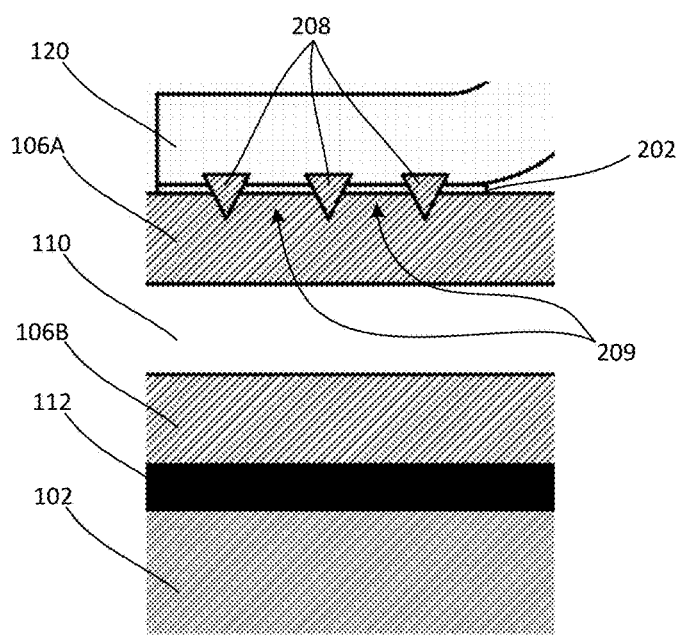
FIG. 3 is a detailed cross-sectional view illustrating a bonding region between a terminal lead and a substrate of the power semiconductor device of FIG. 1.

Using a laser device 203, the laser bonding technique of the present disclosure employs laser treatment to affix or bond the terminal 120 to the first conductive layer 106A in a manner sufficient to allow electrical current to flow from the terminal 120 to the first conductive layer 106A and vice-versa. Particularly, a laser beam 204 may be directed at a top surface of the terminal 120 above an area where the terminal 120 is to be bonded to the first conductive layer 106A, hereinafter referred to as "the bonding region 206." The energy of the laser beam 204 causes the solid materials of the terminal 120 and the first conductive layer 106A to be transformed (melted with consecutive rapid solidification), resulting in weld connections 208 therebetween as shown in the detailed view of FIG. 3.

The weld connections 208 may be separated by spaces or gaps 209 (as dictated by the particular weld pattern employed) where the terminal 120 and the first conductive layer 106A are not welded together. However, heat generated by the laser treatment may be sufficient to melt the thin metallic layer 202, whereafter the molten material of the thin metallic layer 202 may flow into the gaps 209 as motivated by capillary forces and wettability of the surrounding surfaces of the terminal 120 and the first conductive layer 106A. After filing the gaps 209 between/adjacent the weld connections 208, the molten material of the thin metallic layer 202 may cool and solidify and, in combination with the weld connections 208, may provide robust electrical and mechanical connections between the terminal 120 and the first conductive layer 106A. The laser bonding technique of the present disclosure thereby reduces the likelihood of mechanical failure (e.g., cracking) in the bonding region 206 and improves the conductivity and reliability of the bond relative to traditional laser bonding techniques.

Figure 4:
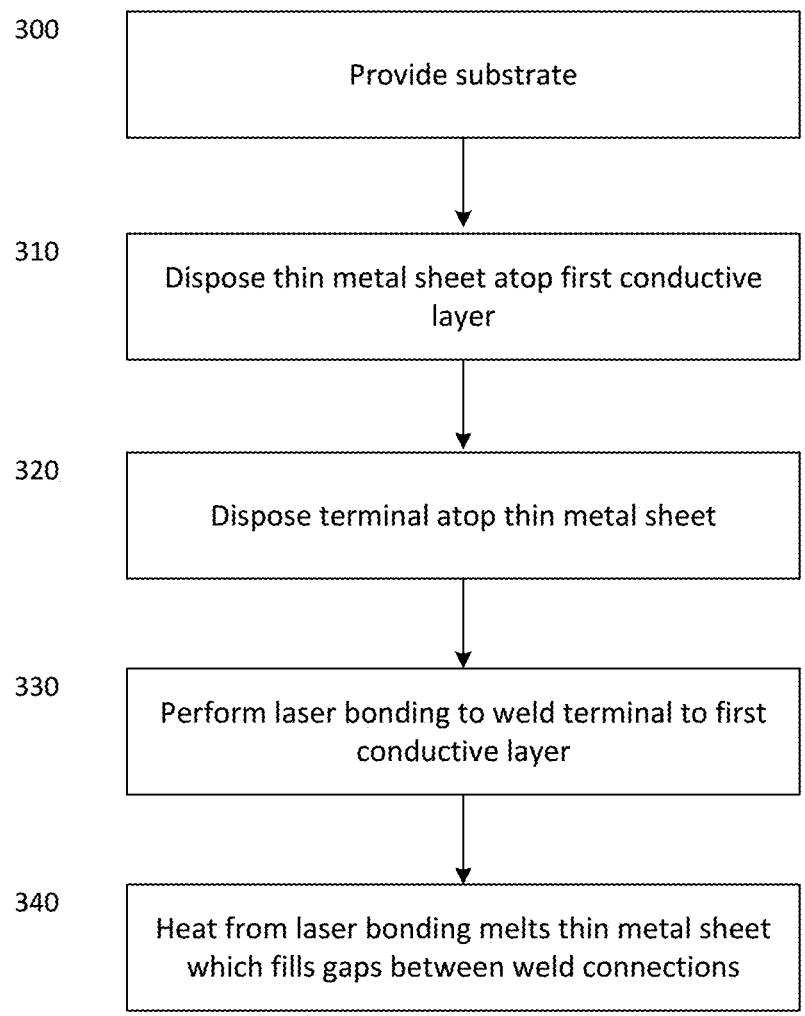
FIG. 4 is a flow diagram illustrating an exemplary laser bonding method for connecting a terminal lead to a substrate of the power semiconductor device of FIG. 1.

Referring to FIG. 4, a flow diagram illustrating an embodiment of the laser bonding technique of the present disclosure is shown. The method will now be described in conjunction with the illustrations of the device 100 shown in FIGS. 2 and 3.

At block 300 of the exemplary method, the substrate 104 may be provided, wherein the substrate 104 includes the insulating layer 110 and first and second conductive layers 106A, 106B disposed on top and bottom surfaces of the insulating layer 110, respectively. The substrate 104 may be positioned atop a heatsink 102 with the second conductive layer 106B soldered or sintered to the heatsink 102. At block 310 of the method, the thin metallic layer 202 formed of a low melting point metal may be disposed atop the first conductive layer 106A. At block 320 of the method, the terminal 120 may be placed atop the thin metallic layer 202.

At block 330 of the exemplary method, the laser device 203 may be used to direct the laser beam 204 at the top surface of the terminal 120 above an area where the terminal 120 is to be bonded to the first conductive layer 106A. The energy of the laser beam 204 may melt the solid materials of the terminal 120 and the first conductive layer 106A to be transformed (melted with consecutive rapid solidification), resulting in weld connections 208 therebetween. At block 340 of the method, which may happen simultaneously with the action of block 330, heat generated by the laser treatment may melt the thin metallic layer 202, whereafter the molten material of the thin metallic layer 202 may flow into the gaps 209 as motivated by capillary forces and wettability of the surrounding surfaces of the terminal 120 and the first conductive layer 106A. After filling the gaps 209 between/ adjacent the weld connections 208, the molten material of the thin metallic layer 202 may cool and solidify and, in combination with the weld connections 208, may provide robust electrical and mechanical connections between the terminal 120 and the first conductive layer 106A.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure makes reference to certain embodiments, numerous modifications, alterations and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. A power semiconductor device comprising:
   a heatsink;
   a substrate disposed atop the heatsink;
   a semiconductor die disposed atop the substrate and electrically connected to the substrate; and
   a terminal disposed atop the substrate and electrically connected to the substrate by laser-formed weld connections separated by gaps, wherein a thin metallic layer disposed between the terminal and the substrate is melted during the laser welding operation and molten material of the thin metallic layer flows into and fills the gaps between the weld connections;
   wherein the thin metallic layer has a thickness in a range of 20-100 μm.

2. The power semiconductor device of claim 1, wherein the thin metallic layer is formed of a metal different from a metal from which the weld connections are formed.

3. The power semiconductor device of claim 1, wherein the substrate is a multilayer structure that includes an insulating layer, a first conductive layer disposed on a top surface of the insulating layer, and a second conductive layer disposed on a bottom surface of the insulating layer.

4. The power semiconductor device of claim 3, wherein the first and second conductive layers are formed of copper.

5. The power semiconductor device of claim 3, wherein the insulating layer is formed of ceramic.

6. The power semiconductor device of claim 1, wherein the terminal is formed of one of copper, copper alloy, aluminum, aluminum alloy, silver, and silver alloy.

7. The power semiconductor device of claim 6, wherein the terminal is plated with one of nickel, silver, and gold.

8. The power semiconductor device of claim 1, further comprising an encapsulation layer that covers and encases the semiconductor die and the terminal with a portion of the terminal protruding from the encapsulation layer.

9. The power semiconductor device of claim 8, wherein the encapsulation layer is formed of at least one of silicone gel and epoxy molding compound.

* * * * *